US011650254B2

(12) United States Patent
Lee et al.

(10) Patent No.: US 11,650,254 B2
(45) Date of Patent: May 16, 2023

(54) BATTERY MANAGEMENT SYSTEM

(71) Applicant: SK On Co., Ltd., Seoul (KR)

(72) Inventors: Jae Hee Lee, Daejeon (KR); Ki Man La, Daejeon (KR); Sang Hae Park, Daejeon (KR); Jeong Min Seo, Daejeon (KR); Ki Bum Sung, Daejeon (KR); Ho Sang Jang, Daejeon (KR)

(73) Assignee: SK On Co., Ltd., Seoul (KR)

( * ) Notice: Subject to any disclaimer, the term of this patent is extended or adjusted under 35 U.S.C. 154(b) by 0 days.

(21) Appl. No.: 17/149,797

(22) Filed: Jan. 15, 2021

(65) Prior Publication Data

US 2021/0223320 A1     Jul. 22, 2021

(30) Foreign Application Priority Data

Jan. 16, 2020   (KR) .................. 10-2020-0005954

(51) Int. Cl.
| | |
|---|---|
| *G01R 31/00* | (2006.01) |
| *G01R 31/371* | (2019.01) |
| *G01R 31/396* | (2019.01) |
| *H02J 7/00* | (2006.01) |

(52) U.S. Cl.
CPC ......... *G01R 31/371* (2019.01); *G01R 31/396* (2019.01); *H02J 7/00032* (2020.01); *H02J 7/0047* (2013.01)

(58) Field of Classification Search
USPC .................. 324/426, 430, 432, 434–436
See application file for complete search history.

(56) References Cited

U.S. PATENT DOCUMENTS

| | | | |
|---|---|---|---|
| 2004/0212941 A1* | 10/2004 | Haas .................. | H04N 1/00127 361/90 |
| 2014/0013164 A1 | 1/2014 | Ma et al. | |
| 2020/0274369 A1* | 8/2020 | Luo ........................ | B60L 3/0084 |
| 2021/0028631 A1* | 1/2021 | Hwang ................... | H02J 50/80 |

FOREIGN PATENT DOCUMENTS

| | | |
|---|---|---|
| KR | 1020130068114 A | 6/2013 |
| KR | 1020140008547 A | 1/2014 |

\* cited by examiner

*Primary Examiner* — Vincent Q Nguyen
(74) *Attorney, Agent, or Firm* — The Webb Law Firm

(57) ABSTRACT

A battery management system includes a microcontroller unit which transmits and receives communications information through a communications input/output terminal, a fault generator unit which generates fault information and transmits the fault information through a fault information output terminal, and a battery cell monitoring unit which is coupled to the communications input/output terminal and the fault information output terminal and diagnoses an operation of internal function based on the fault information transmitted from the fault generator unit and outputs an internal diagnosis result value to the microcontroller unit.

18 Claims, 3 Drawing Sheets

BATTERY MANAGEMENT SYSTEM

CROSS-REFERENCE TO RELATED APPLICATION

This application claims priority to Korean Patent Application No. 10-2020-0005954 filed Jan. 16, 2020, the disclosure of which is hereby incorporated by reference in its entirety.

BACKGROUND OF THE INVENTION

1. Field of the Invention

The present disclosure relates to a battery management system.

2. Description of Related Art

The operation of an electric vehicle has recently increased. Accordingly, there is an increasing importance of the functional safety (ISO26262) of a battery management system used for a battery mounted in an electric vehicle. In particular, the battery management system requires a safety rating of ASIL C or higher. Therefore, it is necessary to verify whether the battery management system may be converted to a safety status when an internal fault occurs in a system semiconductor such as a battery cell monitoring integrated circuit (IC) in the battery management system.

SUMMARY OF THE INVENTION

An aspect of the present disclosure may provide a battery management system in which a fault information input terminal is positioned in a battery cell monitoring unit, thereby easily and directly injecting an internal fault into the battery cell monitoring unit, and it is thus possible to determine whether the battery management system is converted to a safety status.

According to an aspect of the present disclosure, a microcontroller unit transmitting and receiving communications information through communications input/output terminal; a fault generator unit generating fault information and transmitting the fault information through a fault information output terminal; and a battery cell monitoring unit coupled to the communications input/output terminal and the fault information output terminal, and configured to diagnose an operation of internal function based on the fault information transmitted from the fault generator unit and output an internal diagnosis result value to the microcontroller unit.

BRIEF DESCRIPTION OF THE DRAWINGS

The above and other aspects, features, and advantages of the present disclosure will be more clearly understood from the following detailed description taken in conjunction with the accompanying drawings, in which.

DESCRIPTION OF THE INVENTION

Hereinafter, exemplary embodiments in the present disclosure will now be described in detail with reference to the accompanying drawings.

Figure 1:
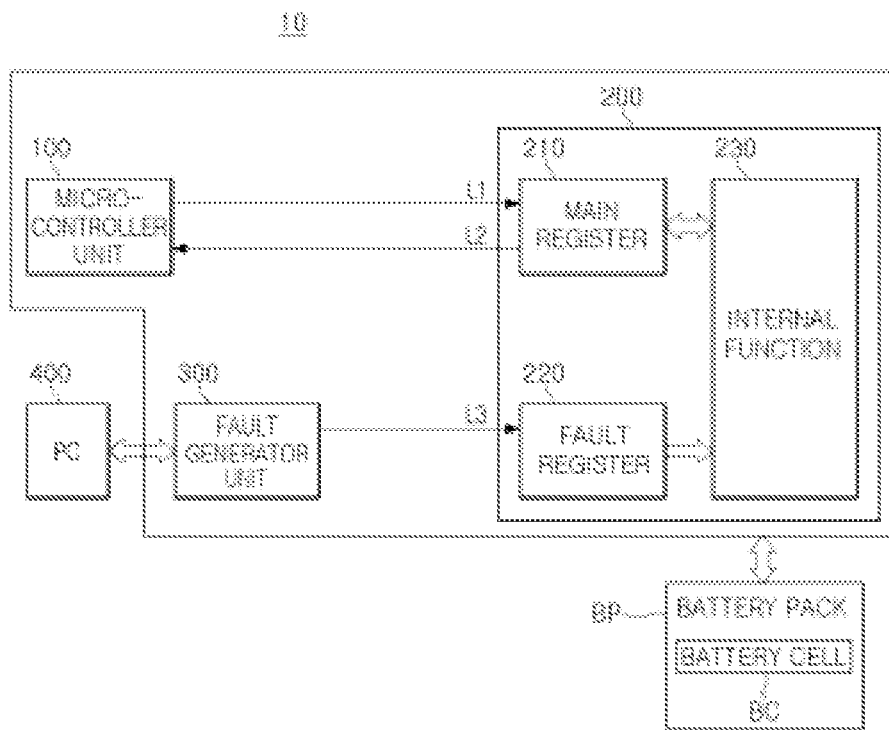
FIG. 1 is a block diagram illustrating a battery management system according to an exemplary embodiment in the present disclosure.
Figure 2:
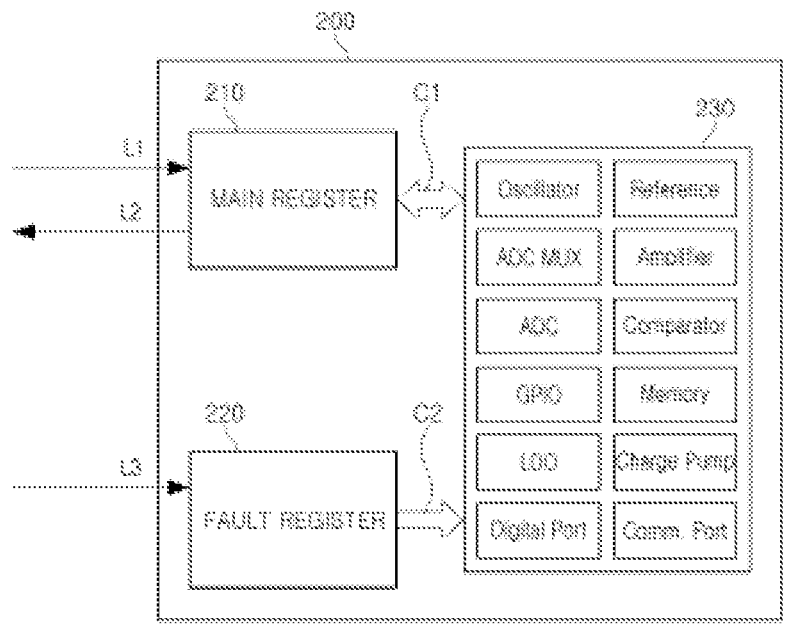
FIGS. 2 and 3 are diagrams each showing a process in which a fault is input to a battery cell monitoring unit.
Figure 3:
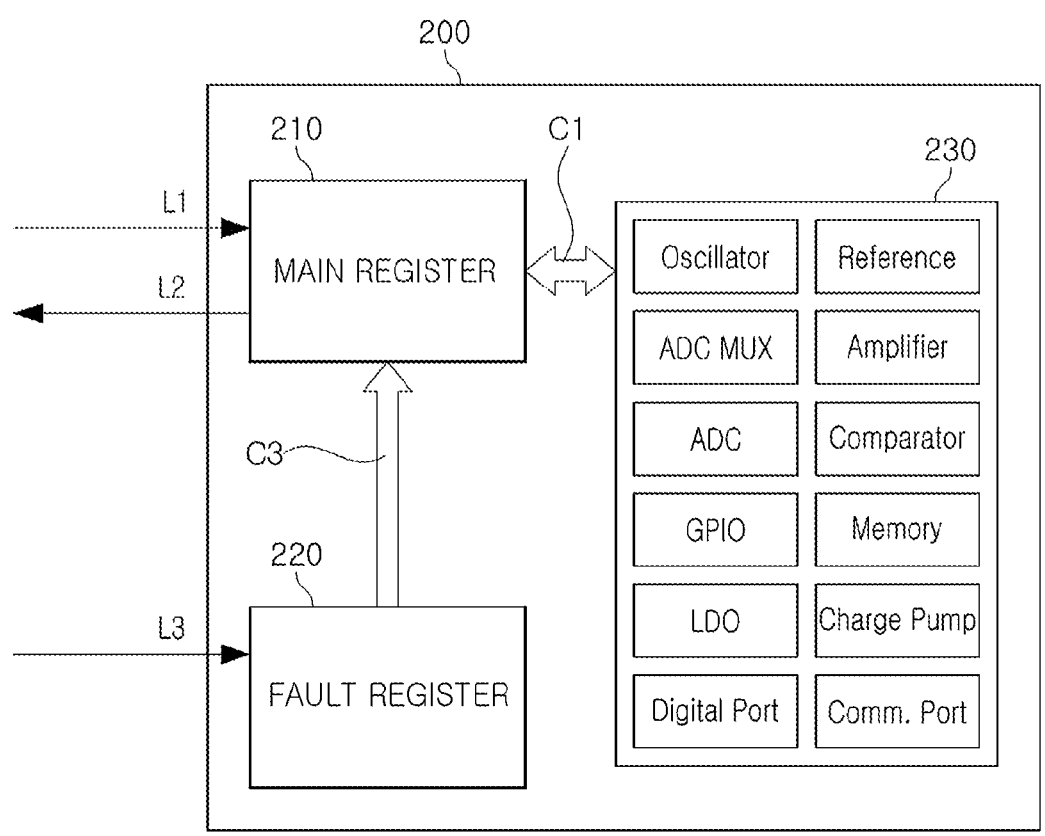

FIG. 1 is a block diagram illustrating a battery management system according to an exemplary embodiment in the present disclosure; and FIGS. 2 and 3 are diagrams each showing a process in which a fault is input to a battery cell monitoring unit.

A battery management system 10 according to an exemplary embodiment may include: a microcontroller unit 100; a fault generator unit 300; and a battery cell monitoring unit 200. The battery management system 10 may be connected to a battery pack BP to control whether the battery pack BP is operated and connected thereto.

The microcontroller unit 100 may include a communication input/output terminal or a plurality of communication input/output terminals. The microcontroller unit 100 may transmit communications information to the battery cell monitoring unit 200 through the communications output terminal, and may receive communications information transmitted from the battery cell monitoring unit 200 through the communications input terminal. That is, the microcontroller unit 100 may be connected to the battery cell monitoring unit 200 through a first line L1 and a second line L2. Communications information may include information such as the voltage, current, temperature and the like of a battery cell, and may also include an internal fault signal to be described below. When receiving the internal fault signal from the battery cell monitoring unit 200, the microcontroller unit 100 may stop the operation of a relay device, load device or the like, thereby blocking its connection with the battery pack BP connected to the battery management system 10. In this manner, the battery management system 10 may be converted to a safety status.

The fault generator unit 300 may generate fault information and output the generated fault information to the battery cell monitoring unit 200. The fault generator unit 300 may be connected to a separate control device such as a personal computer (PC) 400 through a communications port such as a universal serial bus (USB) to program the fault information. However, the communications port is not limited to the USB, may be various types of communications ports such as a serial programming interface (SPI), an inter-integrated circuit (I²C), a universal asynchronous receiver/transmitter (UART) and a serial communications, and may also be an insulated communications port using a galvanic isolator or a transformer.

The fault generator unit 300 may be connected to a fault signal input terminal of the battery cell monitoring unit 200 and input the generated fault information. The battery cell monitoring unit 200 may operate and check an internal function 230 based on the input fault information. That is, the fault generator unit 300 may be connected to the battery cell monitoring unit 200 through a third line L3.

The fault generator unit 300 may be connected to the battery cell monitoring unit 200 through a detachable connection terminal. Therefore, the fault generator unit 300 may be attached to or detached from the battery management system 10 as needed. If necessary, the fault generator unit 300 may be attached to the battery management system 10 only in a process of determining whether the battery cell monitoring unit 200 outputs the fault signal, and then be detached from the battery management system 10 after the determining is completed.

The battery cell monitoring unit 200 may receive information on a status of the battery cell and may generate a battery diagnosis result value indicating a diagnosis based on a status of the battery pack using the received status information. The battery cell monitoring unit 200 may store electrical energy and may receive the status information of a plurality of battery cells BC included in the battery pack BP that supplies the stored electrical energy. The state information of the battery cell may include information such as the voltage, current, temperature and the like of each battery cell. The battery cell monitoring unit 200 may be formed of a battery cell monitor integrated circuit (IC).

In some exemplary embodiments, a plurality of battery cell monitoring units 200 may be provided, and the respective battery cell monitoring units 200 may be connected to each other in a daisy chain. In this case, the fault information may be transmitted to each of the plurality of battery cell monitoring units 200 using one fault generator unit 300.

In addition, the battery cell monitoring unit 200 may diagnose the operation of the internal function 230 based on the fault information received from the fault generator unit 300, and output an internal diagnosis result value to the microcontroller unit 100.

The battery cell monitoring unit 200 may include a main register 210 and a fault register 220 therein. In addition, the battery cell monitoring unit 200 may be connected to the fault generator unit 300 through the connection terminal electrically separated from the connection terminals connected to the main register 210 and the fault register 220. That is, the battery cell monitoring unit 200 may include the separate connection terminal transmitting the fault information to the fault register 220.

The main register 210 may be connected to the communications input/output terminals of the microcontroller unit 100 through the first line L1 and the second line L2, and may store the communications information transmitted from the microcontroller unit 100. In addition, the main register 210 may store the internal diagnosis result value generated based on the fault information transmitted from the fault generator unit 300. In addition, the main register 210 may output a control signal C1 for performing the operation of the internal function 230 of the battery cell monitoring unit 200 to diagnose whether the internal function 230 is operating normally. The internal function 230 may include a general purpose input/output (GPIO), a reference voltage, a comparator, an analog-to-digital converter (ADC) and the like.

The fault register 220 may be connected to a fault information output terminal of the fault generator unit 300 through the third line L3, and may operate the internal function 230 based on the transmitted fault information. In some exemplary embodiments, the fault register 220 may output the internal fault signal to the fault generator unit 300 through a fourth line L4.

The description describes a process in which the fault register 220 operates the internal function 230 based on the fault information with reference to FIGS. 2 and 3.

FIG. 2 shows a case where the fault register 220 directly transmits a control signal C2 to the internal function 230 to operate the internal function 230. The fault register 220 may transmit the control signal to cause the internal function 230 of the battery cell monitoring unit 200 to be operated abnormally based on the fault information, thereby generating the internal fault signal of the battery cell monitoring unit 200. For example, the fault register 220 may adjust the reference voltage supplied to the ADC, thereby causing an incorrect ADC value to be output, and the internal fault signal may be recorded (C1) in the main register 210 by the internal diagnosis function of the battery cell monitoring unit 200. In this manner, the internal fault signal stored in the main register 210 may be transmitted to the microcontroller unit 100 through the second line L2.

FIG. 3 shows a case where the fault register 220 randomly records (C3) a value in an abnormal range in the normal internal diagnosis result value stored in the main register 210, thereby generating the internal fault signal of the battery cell monitoring unit 200.

As described above, the battery management system 10 of an exemplary embodiment may input the fault information through the fault input terminal of the battery cell monitoring unit 200, and generate the internal fault signal of the battery cell monitoring unit 200. Therefore, it is possible to easily determine whether the battery cell monitoring unit 200 is operating normally.

In addition, the battery management system 10 of an exemplary embodiment does not modify the first line L1 and the second line L2, which are communications lines between the microcontroller unit 100 and the battery cell monitoring unit 200, and may thus be operated independently of the microcontroller unit 100 and the battery cell monitoring unit 200. Therefore, the battery management system 10 does not affect the operations of the microcontroller unit 100 and the battery cell monitoring unit 200.

Accordingly, it is possible to easily diagnose the faulty operation of the battery management system 10, and easily detach the fault generator unit 300 from the battery management system 10. It is thus possible to diagnose the faulty operation of the battery management system 10 without damage thereto.

Figure 4:
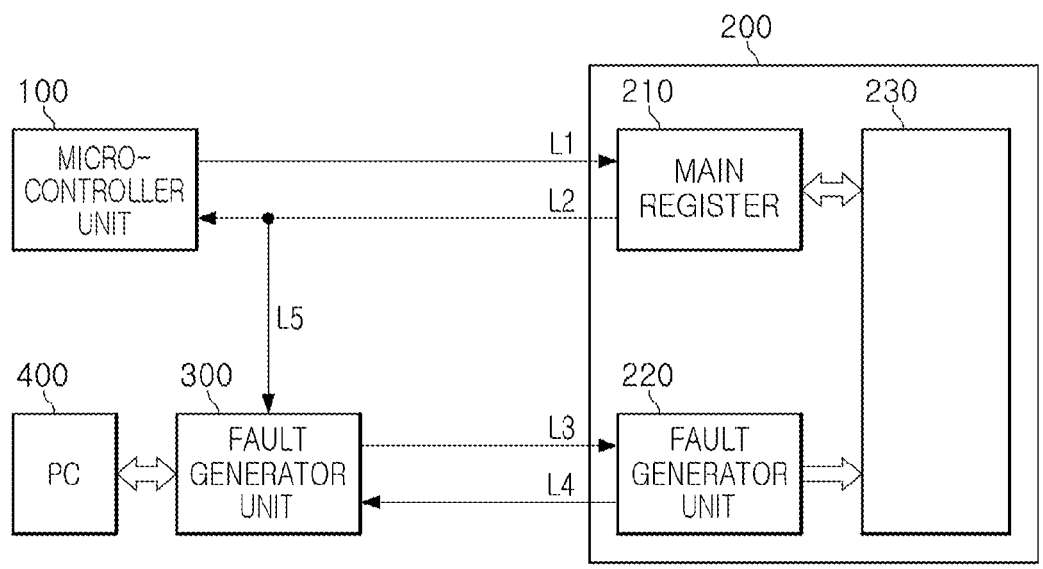
FIG. 4 is a block diagram illustrating a battery management system according to another exemplary embodiment.

Referring to FIG. 4, the description describes a battery management system 20 according to another exemplary embodiment. The same reference numerals as in the above-described exemplary embodiment respectively denote the same components, and a detailed description thereof is thus omitted.

When compared with the above-described exemplary embodiment, another exemplary embodiment of FIG. 4 is different therefrom in that the fourth line L4 is added between the fault generator unit 300 and the battery cell monitoring unit 200, and a fifth line L5 is branched from the second line L2 between the microcontroller unit 100 and the battery cell monitoring unit 200 to be feedbacked to the fault generator unit 300.

Therefore, the fault generator unit 300 may receive the internal fault signal generated by the fault register 220 of the battery cell monitoring unit 200 through the fourth line L4. In addition, a determination result value may be feedbacked to the fault generator unit 300 through the fifth line L5 branched from the second line L2.

Therefore, it is possible to determine whether the internal fault signal generated by the fault generator 300 is properly input to the battery cell monitoring unit 200, and whether the internal diagnosis result value intended by the battery cell monitoring unit 200 is generated based on the input internal fault signal.

Figure 5:
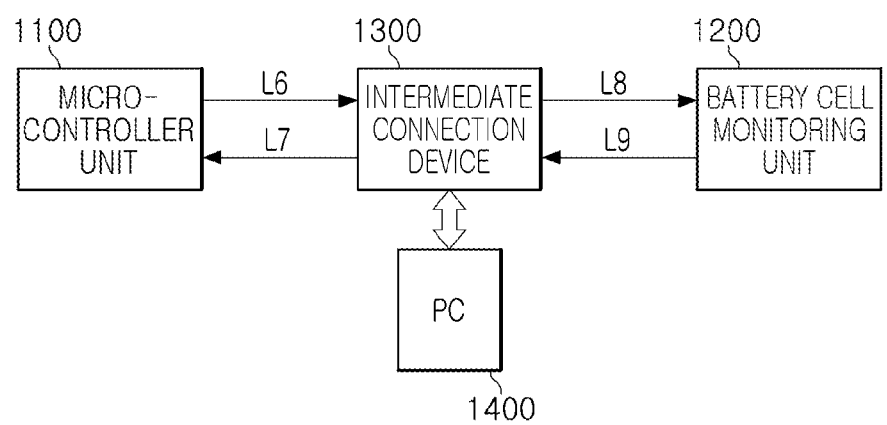
FIG. 5 is a block diagram illustrating a battery management system of a comparative example.

The description describes an advantage of an exemplary embodiment in comparison with a comparative example. FIG. 5 is a diagram illustrating the comparative example in which an intermediate connection device 1300 is connected between a microcontroller unit 1100 and a battery cell monitoring unit 1200.

The intermediate connection device 1300 may have a communications unit which may interface communications between the microcontroller unit 1100 and the battery cell monitoring unit 1200, and may be controlled by a control device such as a personal computer (PC) 1400. That is, the intermediate connection device 1300 of the comparative example may be connected to the microcontroller unit 1100 through a sixth line L6 and a seventh line L7, and connected to the battery cell monitoring unit 1200 through an eighth line L8 and a ninth line L9.

The intermediate connection device 1300 may receive communications information from the microcontroller unit 1100 through the sixth line L6 and transmit the communications information to the battery cell monitoring unit 200 through the eighth line L8. Here, the intermediate connection device 1300 may transmit fault information along with the existing communications information to the battery cell monitoring unit 1200. The battery cell monitoring unit 1200 may diagnose its internal function based on the transmitted fault information and transmit the internal diagnosis result value to the intermediate connection device 1300.

Here, it is possible to generate a normal internal diagnosis result value only when the intermediate connection device 1300 controls the hardware and software of the microcontroller unit 1100 while not affecting a scheduling of the software. In addition, it is possible to inject the fault information into the battery cell monitoring unit 1200 only when there is no delay in time for communications between the microcontroller unit 1100 and the battery cell monitoring unit 1200. Accordingly, an unintended fault may occur if a fault injected from the intermediate connection device 1300 causes a time delay in the scheduling of the software of the microcontroller unit 1100. In addition, there is a need to physically disconnect a circuit between the microcontroller unit 1100 and the battery cell monitoring unit 1200 in order to dispose the intermediate connection device 1300 therebetween, and the intermediate connection device 1300 may then be connected between the microcontroller unit 1100 and the battery cell monitoring unit 1200. In this process, the microcontroller unit 1100 and the battery cell monitoring unit 1200 may be damaged, thereby damaging an entire battery management system 30.

Compared to the comparative example, an exemplary embodiment shows that the fault input terminal is added to inject the fault into the battery cell monitoring unit 200, and the internal fault may be injected into the battery cell monitoring unit 200 even while the battery management system 10 is operated. Therefore, a fault of the hardware or software may be easily injected into the battery cell monitoring unit 200, and it is thus possible to easily verify the functional safety (ISO26262) of the battery management system.

In addition, the fault may be input to the battery cell monitoring unit 200 using the fault input terminal, and thus there is no need to physically disconnect a circuit between the microcontroller unit 100 and the battery cell monitoring unit 200. Therefore, the battery management system 10 may verify its functional safety without damage thereto.

As set forth above, the fault generator unit and the battery management system using the same according to the present disclosure may directly inject the internal fault into the battery cell monitoring unit, and it is thus possible to determine whether the battery management system is converted to the safety status.

While exemplary embodiments have been shown and described above, it will be apparent to those skilled in the art that modifications and variations could be made without departing from the scope of the present disclosure as defined by the appended claims.

What is claimed is:

1. A battery management system comprising:
   a microcontroller unit transmitting and receiving communications information through a communications input/output terminal;
   a fault generator unit generating fault information and transmitting the fault information through a fault information output terminal; and
   a battery cell monitoring unit receiving status information of a plurality of battery cells in a battery pack, coupled to the communications input/output terminal and the fault information output terminal, and including an internal function,
   wherein the battery cell monitoring unit diagnoses an operation of the internal function based on the fault information transmitted from the fault generator unit and outputs an internal diagnosis result value to the microcontroller unit,
   the microcontroller unit and the battery cell monitoring unit are coupled to each other through a first line and a second line,
   the fault generator unit and the battery cell monitoring unit are coupled to each other through a third line and a fourth line, and
   the internal diagnosis result value is feedbacked to the fault generator unit through a fifth line branched from the second line.

2. The battery management system of claim 1, wherein the battery cell monitoring unit includes a main register coupled to the communications input/output terminal to store a communications signal transmitted from the microcontroller unit; and
   a fault register coupled to the fault information output terminal to store the fault information outputted from the fault generator unit.

3. The battery management system of claim 2, wherein the fault register controls the internal function to operate abnormally based on the fault information.

4. The battery management system of claim 2, wherein the fault register records an abnormal range in the main register for generating an internal fault signal stored in the main register.

5. The battery management system of claim 2, wherein the fault register has an input/output terminal separated from that of the main register.

6. The battery management system of claim 1, wherein the microcontroller unit disconnects from the battery pack when an internal fault signal is included in the internal diagnosis result value.

7. The battery management system of claim 1, wherein the fault information output terminal is detachably coupled to the battery cell monitoring unit.

8. A battery management system comprising:
   a microcontroller unit transmitting and receiving communications information through communications input/output terminal;
   a fault generator unit generating fault information and transmitting the fault information through a fault information output terminal; and
   a battery cell monitoring unit receiving status information of a plurality of battery cells in a battery pack, coupled to the communications input/output terminal and the fault information output terminal, and including an internal function, wherein the battery cell monitoring unit diagnoses an operation of the internal function based on the fault information transmitted from the fault generator unit and outputs an internal diagnosis result value to the microcontroller unit, the battery cell monitoring unit includes a main register coupled to the communications input/output terminal to store a communications signal transmitted from the microcontroller unit, a fault register coupled to the fault information output terminal to store the fault information outputted from the fault generator unit, and the fault register controls the internal function to operate abnormally based on the fault information.

9. The battery management system of claim 8, wherein the internal diagnosis result value is feedbacked to the fault generator unit.

10. The battery management system of claim 8, wherein the fault register records a value in an abnormal range in the main register for generating an internal fault signal stored in the main register.

11. The battery management system of claim 8, wherein the fault register has input/output terminal separated from that of the main register.

12. The battery management system of claim 8, wherein the microcontroller unit disconnects from the battery pack when an internal fault signal is included in the internal diagnosis result value.

13. The battery management system of claim 8, wherein the fault information output terminal is detachably coupled to the battery cell monitoring unit.

14. A battery management system comprising:
a microcontroller unit transmitting and receiving communications information through communications input/output terminal;

a fault generator unit generating fault information and transmitting the fault information through a fault information output terminal; and a battery cell monitoring unit receiving status information of a plurality of battery cells in a battery pack, coupled to the communications input/output terminal and the fault information output terminal, and including an internal function, wherein the battery cell monitoring unit diagnoses an operation of the internal function based on the fault information transmitted from the fault generator unit and outputs an internal diagnosis result value to the microcontroller unit, the battery cell monitoring unit includes a main register coupled to the communications input/output terminal to store a communications signal transmitted from the microcontroller unit, a fault register coupled to the fault information output terminal to store the fault information outputted from the fault generator unit, and the fault register has input/output terminal separated from that of the main register.

15. The battery management system of claim 14, wherein the internal diagnosis result value is feedbacked to the fault generator unit.

16. The battery management system of claim 14, wherein the fault register records a value in an abnormal range in the main register for generating an internal fault signal stored in the main register.

17. The battery management system of claim 14, wherein the microcontroller unit disconnects from the battery pack when an internal fault signal is included in the internal diagnosis result value.

18. The battery management system of claim 14, wherein the fault information output terminal is detachably coupled to the battery cell monitoring unit.

* * * * *